United States Patent
Sanada

[11] Patent Number: 6,136,230
[45] Date of Patent: Oct. 24, 2000

[54] ELECTRICALLY CONDUCTIVE PASTE AND GLASS SUBSTRATE HAVING A CIRCUIT THEREON

[75] Inventor: Tomoki Sanada, Kyoto, Japan

[73] Assignee: Murata Manufacturing Co., Ltd., Japan

[21] Appl. No.: 09/360,016

[22] Filed: Jul. 23, 1999

[30] Foreign Application Priority Data

Jul. 24, 1998 [JP] Japan .................................. 10-225346

[51] Int. Cl.⁷ .................................................. H01B 1/06
[52] U.S. Cl. .................................. 252/518.1; 252/521.3; 252/521.4; 252/519.13; 252/511; 252/512; 252/514
[58] Field of Search ........................ 252/519.32, 520.3, 252/521.3, 521.4, 511, 514, 512, 518, 519.13; 428/428

[56] References Cited

U.S. PATENT DOCUMENTS

| | | | |
|---|---|---|---|
| 3,755,723 | 8/1973 | Short | 317/258 |
| 5,176,853 | 1/1993 | Sarma et al. | 252/512 |
| 5,958,597 | 9/1999 | Yamana | 428/428 |

*Primary Examiner*—Yogendra Gupta
*Assistant Examiner*—Derrick G. Hamlin
*Attorney, Agent, or Firm*—Ostrolenk, Faber, Gerb & Soffen, LLP

[57] ABSTRACT

A lead-free electrically conductive paste which can be fired at low temperature and has excellent wettability to a solder, as well as a glass substrate having a circuit suitable for producing an automobile window having an antifogging property. The electrically conductive paste comprises an electrically conductive component, glass frit and a vehicle, wherein B—Bi—O or B—Si—Bi—O glass frit is used as the glass frit. A circuit is formed on a glass substrate by use of the electrically conductive paste to thereby provide an automobile window having an antifogging property.

9 Claims, 1 Drawing Sheet

ELECTRICALLY CONDUCTIVE PASTE AND GLASS SUBSTRATE HAVING A CIRCUIT THEREON

BACKGROUND OF THE INVENTION

1. Field of the Invention

The present invention relates to an electrically conductive paste for forming an electrode or a circuit on a substrate such as a glass substrate, and more particularly, to an electrically conductive paste which is applied and baked to form an electrode to which an object is soldered by use of a solder containing no lead (hereinafter referred to as "lead-free solder"). The invention also relates to a glass substrate having a circuit thereon suitable for producing, for example, an automobile window having an antifogging property.

2. Background Art

Conventionally, an Sn/Pb eutectic solder has been widely used for soldering a conductor such as a lead terminal to a thick film electrode which is formed by applying and baking an electrically conductive paste.

In recent years, concern about the environment has increased, and material containing no toxic lead, i.e., a lead-free solder, has been gradually replacing a conventionally employed solder for connecting a lead terminal. Typically, there is widely employed a lead-free solder comprising Sn as a primary component and at least one metal selected from a group consisting of Bi, Ag, Zn, In and Sb.

However, when electric connection of a conductor such as a lead terminal is to be established by use of a lead-free solder, heat resistance and wettability of the conductor with respect to a solder are insufficient, resulting in poor reliability in terms of electric connection. This problem is partly due to the presence of a lead borosilicate glass frit contained in an electrically conductive paste which is used so as to enable the paste to be fired at a low temperature that allows use of a glass substrate.

In addition, regarding the glass frit that constitutes an electrically conductive paste, the glass frit itself, like a solder, is desirably employed as a lead-free material, in consideration of the environment.

SUMMARY OF THE INVENTION

To overcome the above described problems, preferred embodiments of the present invention provide an electrically conductive paste which contains no lead, which can be fired at low temperature, and which has excellent heat resistance and wettability with respect to a lead-free solder. The preferred embodiments of the present invention also provide a glass substrate having a circuit thereon, used for an automobile window having an antifogging property for example.

The present inventors have conducted extensive studies and experiments to attain the above objects, and in particular have constructed an electrode through application and baking an electrically conductive paste, and investigated the relationship between the species of the glass frit and heat resistance of the resultant electrode against solder or wettability of the solder with respect to the electrode in the case in which the electrode is soldered with a lead-free solder such as an Sn—Ag—Bi solder or Sn—Ag—Cu solder. As a result, the inventors have found that use of a B—Bi—O glass frit or B—Si—Bi—O glass frit provides excellent heat resistance and wettability with respect to the solder. The present invention has been accomplished based on this finding.

Accordingly, in a first aspect of the present invention, there is provided an electrically conductive paste comprising an electrically conductive component, B—Bi—O glass frit and a vehicle.

By employment of B—Bi—O glass frit, heat resistance and wettability with respect to solder of an electrode formed by applying and baking an electrically conductive paste containing the frit can be enhanced during soldering by use of a lead-free solder.

Preferably, the glass frit comprises $B_2O_3$ in an amount of about 10.0–60.0 mol % and $Bi_2O_3$ in an amount of about 40.0–90.0 mol %.

By employment of glass frit having the above composition, heat resistance and wettability with respect to solder of an electrode formed by applying and baking an electrically conductive paste containing the frit can assuredly be enhanced during soldering by use of a lead-free solder.

More preferably, the glass frit comprises $B_2O_3$ in an amount of about 10.0–29.0 mol % and $Bi_2O_3$ in an amount of about 71.0–90.0 mol %.

By employment of a glass frit having the aforementioned more preferred composition, heat resistance and wettability with respect to solder of an electrode formed by applying and baking an electrically conductive paste containing the frit to a solder can be further enhanced during soldering by use of a lead-free solder.

In a second aspect of the present invention, there is provided an electrically conductive paste comprising an electrically conductive component, B—Si—Bi—O glass frit, and a vehicle.

By employment of B—Si—Bi—O glass frit, heat resistance and wettability with respect to solder of an electrode formed by applying and baking an electrically conductive paste containing the frit can be enhanced during soldering by use of a lead-free solder.

In the electrically conductive paste according to the second aspect of the invention, the glass frit preferably comprises $B_2O_3$ in an amount of about 10.0–60.0 mol %, $SiO_2$ in an amount of about 50.0 mol % or less (excluding 0 mol %) and $Bi_2O_3$ in an amount of about 40.0–90.0 mol %.

By employment of a glass frit having the above composition, heat resistance and wettability with respect to solder of an electrode formed by applying and baking an electrically conductive paste containing the frit can assuredly be enhanced during soldering by use of a lead-free solder.

In the electrically conductive paste according to the second aspect of the invention, the glass frit more preferably comprises $B_2O_3$ in an amount of about 10.0–29.0 mol %, $SiO_2$ in an amount of about 10.0 mol % or less (excluding 0 mol %) and $Bi_2O_3$ in an amount of about 71.0–90.0 mol %.

By employment of a glass frit having the above more preferred composition, heat resistance and wettability with respect to solder of an electrode formed by applying and baking an electrically conductive paste containing the frit can be enhanced during soldering by use of a lead-free solder.

Preferably, in the electrically conductive paste containing an electrically conductive component, the component predominantly comprises (a) Ag or (b) a combination of Ag and at least one metal selected from a group consisting of Cu, Pd and Pt.

By employment of such an electrically conductive component, there can be obtained an electrically conductive paste which can assuredly form an electrode having sufficient electric conductivity.

The electrically conductive paste may further contain Ni or CuO so as to adjust electrical resistance of the paste.

By addition of Ni or CuO, the electrical resistance of the paste is controlled to thereby obtain an electrically conductive paste having desired characteristics, making the present invention even more useful.

In a third aspect of the present invention, the above described electrically conductive paste is used to form an electric conductor by baking thereof, and soldering by a lead-free solder is performed on the electric conductor.

By the above electric conductor, sufficient wettability of the electrode with respect to the solder can be provided.

Thus, an electrode or a conductor can be formed on a substrate such as a glass substrate by use of an electrically conductive paste containing lead-free glass frit, and an electric conductor such as a lead terminal can assuredly be connected to the electrode or conductor by use of a lead-free solder.

In a fourth aspect of the present invention, there is provided a glass substrate having a circuit thereon, wherein the circuit is formed through application of the electrically conductive paste on a glass substrate and baking.

The glass substrate having a circuit thereon exhibits excellent bonding strength between the glass substrate and the circuit and sufficient reliability.

In a fifth aspect of the present invention, there is provided a method for producing an automobile window having an antifogging property comprising the steps of applying the electrically conductive paste on a glass substrate and baking.

The method can provide anti-fogging glass which is useful as an automobile window and which has excellent properties, including enhanced adhesion between the circuit and the glass substrate, high quality and high reliability.

BRIEF DESCRIPTION OF THE DRAWING

Various other objects, features, and many of the attendant advantages of the present invention will be readily appreciated as the same becomes better understood with reference to the following detailed description of the preferred embodiments when considered in connection with an accompanying drawing, in which.

DESCRIPTION OF PREFERRED EMBODIMENTS

Figure 1:
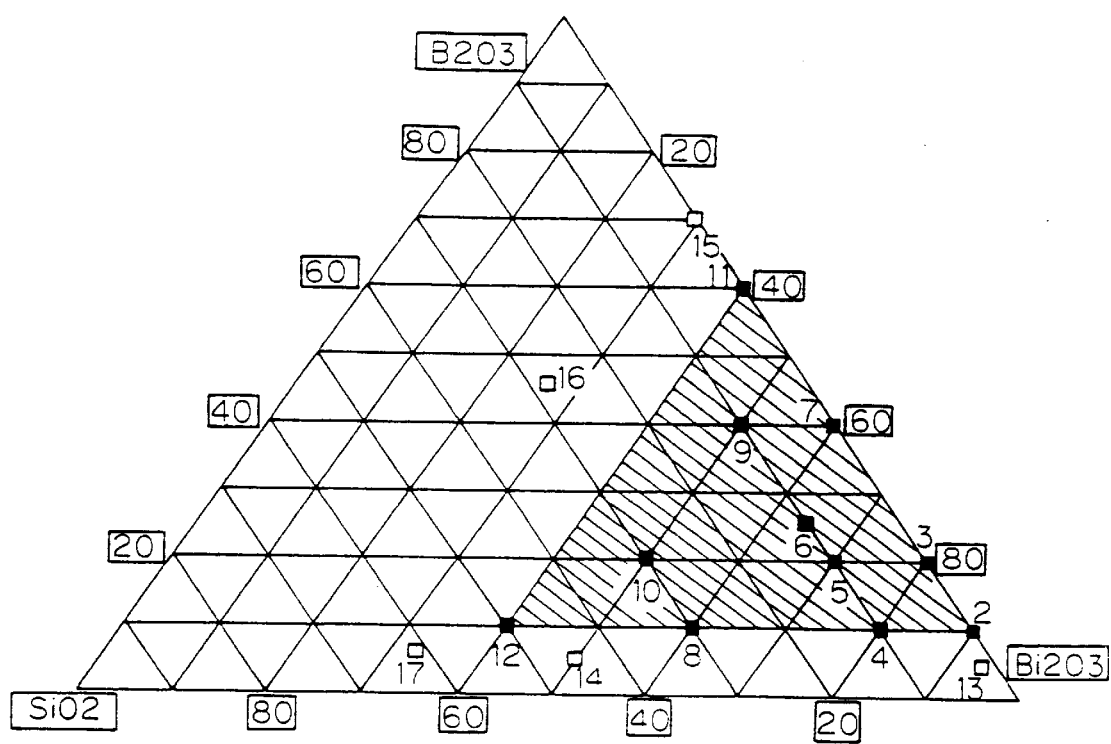
FIG. 1 is a ternary compositional diagram of glass frit samples in the Examples of the present invention.

Various modes of the present invention will next be described in detail by way of examples so as to facilitate understanding of features of the invention.

Production of glass frit

Glass frit samples were produced by the following procedure.

Starting materials $H_3BO_3$, $SiO_2$, $Bi_2O_3$, and $Pb_3O_4$ ($Pb_3O_4$ was used only for Sample No. 1) were mixed so as to attain the compositional proportions shown in Table 1. Each of the resultant mixtures was placed in an alumina crucible, fused at 1200° C. and cooled immediately for vitrification.

The resultant glass was crushed with zirconia balls or like means, to thereby obtain glass frit.

TABLE 1

| | Composition of glass frit | | | |
|---|---|---|---|---|
| Sample No. | $B_2O_3$ | $SiO_2$ | $Bi_2O_3$ | PbO |
| *1 | 17 | 39 | 12 | 32 |
| 2 | 10 | 0 | 90 | 0 |
| 3 | 19 | 0 | 81 | 0 |
| 4 | 10 | 10 | 80 | 0 |
| 5 | 19 | 10 | 71 | 0 |
| 6 | 25 | 11 | 64 | 0 |
| 7 | 40 | 0 | 60 | 0 |
| 8 | 10 | 30 | 60 | 0 |
| 9 | 40 | 10 | 50 | 0 |
| 10 | 21 | 30 | 49 | 0 |
| 11 | 60 | 0 | 40 | 0 |
| 12 | 10 | 50 | 40 | 0 |
| *13 | 5 | 2 | 93 | 0 |
| *14 | 5 | 45 | 50 | 0 |
| *15 | 71 | 1 | 28 | 0 |
| *16 | 47 | 28 | 25 | 0 |
| *17 | 7 | 61 | 32 | 1 |

Samples marked with asterisk (*) fall outside the scope of the present invention.

Glass frit (3 wt. %), Ag powder (76 wt. %), Ni powder (1 wt. %), CuO powder (1 wt. %) and an organic vehicle (19 wt. %) were mixed, and then kneaded and dispersed with a three-roll kneader 8 to thereby produce an electrically conductive paste. A cellulose resin (8 wt %) dissolved in terpineol was used as the organic vehicle.

In this step, Ni powder and CuO powder were added to adjust the electrical resistance.

The electrically conductive paste produced in the manner described above was applied, by way of printing, to a surface of a slide glass substrate (square-shaped soda-lime glass plate; 7.0 mm×7.0 mm×0.4 mm thickness) so as to form a square shape (6 mm×6 mm). The glass plate bearing the paste was dried at 150° C. for 10 minutes, and baked at 640° C. for 1 minute (in-out 5 minutes) to thereby form an electrode.

Evaluation of soldering characteristics

The solderability of the electrode was evaluated through a meniscograph method.

In the meniscograph method, a thick electrode film is dipped in a solder bath or a solder bowl and the buoyancy of the sample is measured to thereby evaluate the heat resistance and wettability of the electrode with respect to the solder.

Specifically, the relation force (wetting force; y-axis) versus time (x-axis) is plotted. The time elapsed before balance between buoyancy and tension is achieved following wetting of the thick electrode film (that is, the time elapsed before the curve crosses the x-axis) is called zero cross time (T0). Also, the time elapsed before the thick electrode film has begun to be "bitten" by the solder and the tension has begun to decrease (that is, the time at which the curve begins to slope downward toward the x-axis) is called "solder biting" start time (T1). The shorter the zero cross time (T0), the better the wettability. The longer the "solder biting" start time (T1), the better the heat resistance.

The results of the solderability test of each sample as measured with respect to an Sn—Ag—Bi solder are shown in Table 2 and those with respect to an Sn—Ag—Cu solder are shown in Table 3. In Tables 2 and 3, the data of Sample No. 1-a represent the results of solderability measurement using a Pb—Sn solder.

TABLE 2

| Sample No. | Wettability (250° C.) (Solder: Sn-Ag-Bi) T0 (s) | Heat resistance (290° C.) (Solder: Sn-Ag-Bi) T1 (s) |
| --- | --- | --- |
| *1-a | 1.5 | 4.8 |
| *1 | 3.5 | 3.5 |
| 2 | 0.8 | 5.0 |
| 3 | 1.0 | 6.5 |
| 4 | 1.2 | 6.7 |
| 5 | 1.1 | 6.3 |
| 6 | 1.4 | 5.7 |
| 7 | 1.3 | 5.1 |
| 8 | 1.9 | 4.7 |
| 9 | 1.5 | 5.8 |
| 10 | 2.5 | 5.5 |
| 11 | 2.0 | 4.9 |
| 12 | 2.8 | 5.1 |
| *13 | 1.5 | 3.8 |
| *14 | 3.5 | 4.1 |
| *15 | 3.0 | 3.1 |
| *16 | 4.0 | 3.5 |
| *17 | 3.7 | 3.6 |

TABLE 3

| Sample No. | Wettability (250° C.) (Solder: Sn-Ag-Cu) T0 (s) | Heat resistance (290° C.) (Solder: Sn-Ag-Cu) T1 (s) |
| --- | --- | --- |
| *1-a | 1.5 | 4.8 |
| *1 | 3.2 | 3.8 |
| 2 | 1.1 | 5.2 |
| 3 | 0.8 | 6.2 |
| 4 | 1.0 | 6.6 |
| 5 | 1.1 | 6.0 |
| 6 | 1.5 | 5.9 |
| 7 | 1.4 | 5.3 |
| 8 | 2.0 | 5.0 |
| 9 | 1.6 | 5.5 |
| 10 | 2.4 | 5.5 |
| 11 | 1.9 | 4.9 |
| 12 | 2.9 | 5.8 |
| *13 | 1.9 | 3.5 |
| *14 | 3.5 | 4.5 |
| *15 | 2.8 | 3.1 |
| *16 | 3.7 | 3.5 |
| *17 | 3.5 | 3.4 |

In Tables 2 and 3, Sample Nos. marked with asterisk (*) are comparative examples, which fall outside the scope of the present invention.

The composition of glass frit of each sample is shown in FIG. 1. The black solid square marks labeled with numerals 2 to 12 represent samples which fall within the scope of the present invention, and white square marks labeled with numerals 13 to 17 represent comparative examples.

As shown in Tables 2 and 3, samples in which electrodes are formed through use of an electrically conductive paste of the present invention exhibit enhanced wettability and enhanced heat resistance as compared with a conventional product (Comparative Example; i.e., Sample No. 1) using Pb glass frit.

Also, it was confirmed that an electrode formed of an electrically conductive paste having a composition falling within the scope of the present invention is equivalent or superior to conventional products in terms of specific resistivity, bonding strength, and so forth, although these results are not shown in Tables 2 and 3.

In the above modes of the invention, Ag powder was used as an electrically conductive component. However, a metal powder which contains at least one metal selected from the group consisting of Ag, Cu, Pd and Pt can also be used as an electrically conductive component.

In the above modes of the invention, an explanation is given of the case in which Ni powder and CuO powder are added so as to adjust the value of electrical resistance. However, depending on the case, addition of Ni powder or CuO powder may not be necessary.

When a circuit is formed on a glass substrate through use of an electrically conductive paste of the present invention, it is possible to obtain antifogging glass useful for an automobile window which realizes high bonding strength with an electrode and enhanced reliability. Descriptions of the production method and specific structure of such an antifogging glass for an automobile window are omitted, as the same do not particularly differ from known ones.

The present invention is not limited only to the above-described modes, and various applications, variations, and modifications are possible so long as the spirit of the invention is not deviated from.

What is claimed is:

1. An electrically conductive paste comprising an electrically conductive component; a glass frit consisting essentially of B, Bi, Si and O; and a vehicle.

2. An electrically conductive paste according to claim 1, wherein the electrically conductive component predominantly comprises Ag or a combination of Ag and at least one metal selected from a group consisting of Cu, Pd and Pt.

3. An electrically conductive paste according to claim 2, which further contains at least one of Ni and CuO.

4. An electrically conductive paste according to claim 1, wherein the glass frit comprises $B_2O_3$ in an amount of about 10.0–60.0 mol %, $SiO_2$ in an amount of about 50.0 mol % or less (excluding 0 mol %), and $Bi_2O_3$ in an amount of about 40.0–90.0 mol %.

5. An electrically conductive paste according to claim 1, wherein the glass frit comprises $B_2O_3$ in an amount of about 10.0–29.0 mol % $SiO_2$ in an amount of about 10.0 mol % or less (excluding 0 mol %), and $Bi_2O_3$ in an amount of about 71.0–90.0 mol %.

6. An electrically conductive paste according to claim 5, wherein the electrically conductive component predominantly comprises Ag or a combination of Ag and at least one metal selected from a group consisting of Cu, Pd and Pt.

7. An electrically conductive paste according to claim 6, which further contains at least one of Ni and CuO.

8. An electrically conductive paste according to claim 4, wherein the electrically conductive component predominantly comprises Ag or a combination of Ag and at least one metal selected from a group consisting of Cu, Pd and Pt.

9. An electrically conductive paste according to claim 8, which further contains at least one of Ni and CuO.

* * * * *